(12) United States Patent  
Jhaveri et al.

(10) Patent No.: US 9,406,547 B2
(45) Date of Patent: Aug. 2, 2016

(54) TECHNIQUES FOR TRENCH ISOLATION USING FLOWABLE DIELECTRIC MATERIALS

(71) Applicant: INTEL CORPORATION, Santa Clara, CA (US)

(72) Inventors: Ritesh Jhaveri, Portland, OR (US); Jeanne L. Luce, Hillsboro, OR (US); Sang-Won Park, Hillsboro, OR (US); Dennis G. Hanken, Hillsboro, OR (US)

(73) Assignee: INTEL CORPORATION, Santa Clara, CA (US)

( * ) Notice: Subject to any disclaimer, the term of this patent is extended or adjusted under 35 U.S.C. 154(b) by 106 days.

(21) Appl. No.: 14/139,964

(22) Filed: Dec. 24, 2013

(65) Prior Publication Data

US 2015/0179501 A1    Jun. 25, 2015

(51) Int. Cl.
*H01L 21/76* (2006.01)
*H01L 21/762* (2006.01)
*H01L 29/06* (2006.01)
*H01L 29/78* (2006.01)
*H01L 29/66* (2006.01)

(52) U.S. Cl.
CPC ...... *H01L 21/76224* (2013.01); *H01L 29/0649* (2013.01); *H01L 29/66795* (2013.01); *H01L 29/785* (2013.01)

(58) Field of Classification Search
CPC ............... H01L 29/66795; H01L 29/7848; H01L 29/785; H01L 29/1054; H01L 29/42392; H01L 29/66816; H01L 21/02587; H01L 21/8232; H01L 21/845; H01L 21/823821
USPC .......................................... 257/506; 438/424
See application file for complete search history.

(56) References Cited

U.S. PATENT DOCUMENTS

| 6,103,576 A  * | 8/2000  | Deustcher ......... H01L 21/28273 257/E21.209 |
| 8,329,587 B2 * | 12/2012 | Liang et al. .................... 438/697 |
| 8,557,712 B1 | 10/2013 | Antonelli et al. |
| 2009/0269569 A1 | 10/2009 | Fucsko et al. |
| 2013/0270641 A1 | 10/2013 | Chi |

(Continued)

OTHER PUBLICATIONS

Kim et al., "Novel Flowable CVD Process Technology for sub-20nm Interlayer Dielectrics," Process Development Team, Semiconductor R&D Center, Thin Film Team, Manufacturing Center, Samsung Electronics Co., Ltd., 2012, 3 Pages.

(Continued)

*Primary Examiner* — Trung Q Dang
(74) *Attorney, Agent, or Firm* — Finch & Maloney PLLC

(57) ABSTRACT

Techniques are disclosed for providing trench isolation of semiconductive fins using flowable dielectric materials. In accordance with some embodiments, a flowable dielectric can be deposited over a fin-patterned semiconductive substrate, for example, using a flowable chemical vapor deposition (FCVD) process. The flowable dielectric may be flowed into the trenches between neighboring fins, where it can be cured in situ, thereby forming a dielectric layer over the substrate, in accordance with some embodiments. Through curing, the flowable dielectric can be converted, for example, to an oxide, a nitride, and/or a carbide, as desired for a given target application or end-use. In some embodiments, the resultant dielectric layer may be substantially defect-free, exhibiting no or an otherwise reduced quantity of seams/voids. After curing, the resultant dielectric layer can undergo wet chemical, thermal, and/or plasma treatment, for instance, to modify at least one of its dielectric properties, density, and/or etch rate.

14 Claims, 4 Drawing Sheets

(56) References Cited

U.S. PATENT DOCUMENTS

| | | |
|---|---|---|
| 2013/0277760 A1 | 10/2013 | Lu et al. |
| 2013/0309838 A1 | 11/2013 | Wei et al. |
| 2014/0190398 A1* | 7/2014 | Garandet .............. C30B 11/003 117/83 |

OTHER PUBLICATIONS

International Search Report and Written Opinion, dated Feb. 26, 2015, received in International Patent Application No. PCT/US2014/066294, 13 pgs.

* cited by examiner

TECHNIQUES FOR TRENCH ISOLATION USING FLOWABLE DIELECTRIC MATERIALS

BACKGROUND

Integrated circuit design in the deep-submicron process nodes (e.g., 32 nm and beyond) involves a number of non-trivial challenges, and particular complications have been faced with respect to fin-based semiconductor architectures. Continued process scaling will tend to exacerbate such problems.

Figure 1:
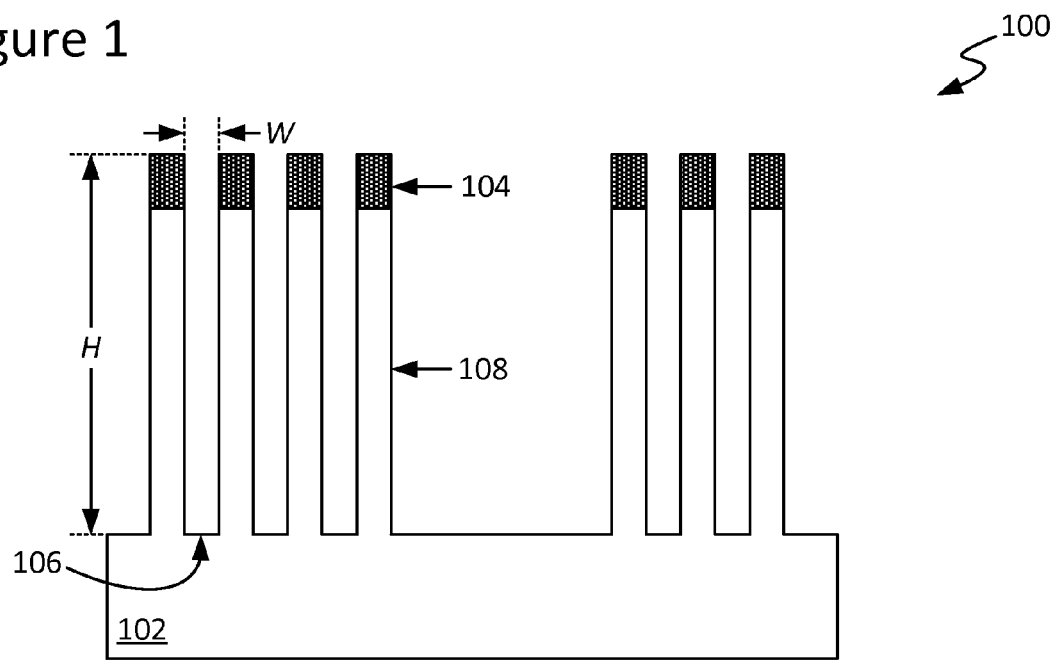
FIG. 1 is a cross-sectional view of an integrated circuit (IC) configured in accordance with an embodiment of the present disclosure.

These and other features of the present embodiments will be understood better by reading the following detailed description, taken together with the figures herein described. In the drawings, each identical or nearly identical component that is illustrated in various figures may be represented by a like numeral. For purposes of clarity, not every component may be labeled in every drawing. Furthermore, as will be appreciated, the figures are not necessarily drawn to scale or intended to limit the described embodiments to the specific configurations shown. For instance, while some figures generally indicate straight lines, right angles, and smooth surfaces, an actual implementation of the disclosed techniques may have less than perfect straight lines, right angles, etc., and some features may have surface topology or otherwise be non-smooth, given real world limitations of fabrication processes. In short, the figures are provided merely to show example structures.

DETAILED DESCRIPTION

Techniques are disclosed for providing trench isolation of semiconductive fins using flowable dielectric materials. In accordance with some embodiments, a flowable dielectric can be deposited over a fin-patterned semiconductive substrate, for example, using a flowable chemical vapor deposition (FCVD) process. The flowable dielectric may be flowed into the trenches between neighboring fins, where it can be cured in situ, thereby forming a dielectric layer over the substrate, in accordance with some embodiments. Through curing, the flowable dielectric can be converted, for example, to an oxide, a nitride, and/or a carbide, as desired for a given target application or end-use. In some embodiments, the resultant dielectric layer may be substantially defect-free, exhibiting no or an otherwise reduced quantity of seams/voids. After curing, the resultant dielectric layer can undergo wet chemical, thermal, and/or plasma treatment, for instance, to modify at least one of its dielectric properties, density, and/or etch rate. Numerous configurations and variations will be apparent in light of this disclosure.

General Overview

Fin-based semiconductor architectures continue to scale in size, giving rise to many issues. One such issue deals with providing sufficient device performance and isolation in the presence of straight and tall semiconductive fins. Traditionally, fin-based devices are isolated from one another using a trench isolation process whereby a dielectric film is used to fill the trenches or the gaps between the fins for three-dimensional architectures. However, for high-aspect-ratio fins and narrow spaces there between, existing dielectric gap-fill processes such as sub-atmospheric CVD (SACVD), low-pressure CVD (LPCVD), plasma-enhanced CVD (PECVD), high-density plasma CVD (HDPCVD), and spin-on deposition (SOD) can have issues with seams/voids, substrate modification, surface sensitivity, adhesion issues, and shrinkage issues. For example, typical CVD processes deposit material at a differential deposition rate, which causes higher deposition to occur on horizontal surfaces than on vertical sidewalls. As a result, pinch-off can occur at the top of neighboring fins, resulting in occlusion and formation of a void within the intervening trench. Also, deposition of material by atomic layer deposition (ALD) typically results in the formation of seams within the trenches. These seams are susceptible to trapping undesirable material as the integrated circuit undergoes further processing.

Thus, and in accordance with some embodiments of the present disclosure, techniques are disclosed for providing trench isolation of semiconductive fins using flowable dielectric materials. In accordance with some embodiments, a flowable dielectric can be deposited over a fin-patterned semiconductive substrate, for example, using a flowable chemical vapor deposition (FCVD) process. The flowable dielectric may be flowed into the trenches between neighboring fins, where it can be cured in situ, thereby forming a dielectric layer over the semiconductive substrate, in accordance with some embodiments. Through curing, the flowable dielectric can be converted, for example, to an oxide, a nitride, and/or a carbide, as desired for a given target application or end-use. Also, in accordance with some embodiments, the resultant dielectric layer may be substantially defect-free, exhibiting no or an otherwise reduced quantity of seams/voids. It should be noted that, as used herein, defect-free may refer to a layer of dielectric material having no defects or any otherwise acceptable level of defects for a given target application or end-use.

After curing, the resultant dielectric layer can undergo any of a wide variety of treatments, including, for example, a wet chemical treatment, a thermal treatment, and/or a plasma treatment. In accordance with some embodiments, post-cure treatment of the dielectric layer may be performed, for example, to modify at least one of its dielectric properties, density, and/or etch rate. Other suitable post-cure treatments will depend on a given application and will be apparent in light of this disclosure.

Some embodiments may be utilized, for example, to provide robust trench isolation for neighboring ultra-tight-pitch fin-based structures. In some instances, sufficient isolation margin between neighboring fin devices may be maintained for high-aspect-ratio trenches. Some embodiments may be utilized, for example, in trench isolation for three-dimensional fin-based architectures.

Some embodiments may eliminate or otherwise reduce seam/void formation on trench openings having a width, for example, less than or equal to about 30 nm, in some instances without significant surface sensitivity or adhesion issues. Some embodiments may realize a reduction in structural dependence for fin-to-fin gaps, as compared to existing approaches. Some embodiments may realize a dielectric layer which exhibits substantial planarity after deposition and curing. Some embodiments may realize improvements in robustness and/or dielectric layer density, but with lower thermal budgets than existing approaches. In accordance with some embodiments, use of the disclosed techniques may be detected, for example, by visual or other inspection (e.g., microscope, etc.) and/or materials analysis of a given IC or other device that has trenches having a width of less than or equal to about 30 nm and which are filled, at least in part, with a dielectric layer that is substantially free of seam/void defects, as described herein.

Methodologies

FIGS. 1-4 illustrate an integrated circuit (IC) fabrication process flow, in accordance with an embodiment of the present disclosure. The process may begin as in FIG. 1, which is a cross-sectional view of an integrated circuit (IC) 100 configured in accordance with an embodiment of the present disclosure. As can be seen, IC 100 initially may include a semiconductive substrate 102. Semiconductive substrate 102 can be formed from any suitable semiconductive material (or combination of such materials), such as, for example, silicon (Si) and/or silicon germanium (SiGe). Also, substrate 102 can have any of a wide range of configurations, including, for example: a bulk substrate; a silicon-on-insulator (SOI) structure; a wafer; and/or a multi-layered structure. Furthermore, the dimensions of substrate 102 can be customized as desired. As will be appreciated in light of this disclosure, it may be desirable to ensure that substrate 102 is of sufficient thickness, for example, to permit formation of one or more semiconductive bodies 108 (discussed below) which are of sufficient dimensions for a given target application or end-use. Other suitable materials, configurations, and dimensions for semiconductive substrate 102 will depend on a given application and will be apparent in light of this disclosure.

IC 100 also initially may include a hardmask layer 104 formed over substrate 102. Hardmask layer 104 can be formed from any suitable hardmask material (or combination of such materials). For example, in some embodiments, hardmask layer 104 can be formed from: a nitride, such as silicon nitride ($Si_3N_4$) or titanium nitride (TiN); an oxide, such as silicon dioxide ($SiO_2$); silicon carbon nitride (SiCN); silicon oxynitride ($SiO_xN_y$); and/or a combination of any one or more thereof. Other suitable materials for hardmask layer 104 will depend on a given application and will be apparent in light of this disclosure.

Hardmask layer 104 can be formed using any suitable technique (or combination of techniques). For example, in accordance with some embodiments, hardmask layer 104 can be formed using: a chemical vapor deposition (CVD) process; physical vapor deposition (PVD) (e.g., sputtering); spin coating/spin-on deposition (SOD); electron beam evaporation; and/or a combination of any one or more thereof. Other suitable techniques for forming hardmask layer 104 will depend on a given application and will be apparent in light of this disclosure.

Furthermore, the dimensions (e.g., thickness) of hardmask layer 104 can be customized as desired for a given target application or end-use. In some instances, hardmask layer 104 may have a substantially uniform thickness over the topology provided, for example, by the underlying semiconductive substrate 102. In some instances, hardmask layer 104 may be provided as a substantially conformal layer over such topology. In some other instances, hardmask layer 104 may be provided with a non-uniform or otherwise varying thickness over such topology. For example, in some cases a first portion of hardmask layer 104 may have a thickness within a first range while a second portion thereof has a thickness within a second, different range. Other suitable dimensions for hardmask layer 104 will depend on a given application and will be apparent in light of this disclosure.

Patterning of hardmask layer 104 can be performed using any suitable lithography technique (or combination of such techniques), as will be apparent in light of this disclosure. The dimensions (e.g., width) of the openings patterned into hardmask layer 104 may contribute to determining, at least in part, the width (W) of the one or more underlying trenches 106 (discussed below) that may be patterned into substrate 102. Other suitable techniques for patterning hardmask layer 104 will depend on a given application and will be apparent in light of this disclosure.

As can be seen in FIG. 1, semiconductive substrate 102 may have a given quantity of trenches 106 formed therein, in accordance with some embodiments. Patterning of substrate 102 with one or more trenches 106 can be performed using any suitable lithography technique (or combination of such techniques), including, for example, wet etch and/or dry etch processes followed by polishing, cleans, etc., as typically done. In accordance with some embodiments, IC 100 may undergo highly directional (e.g., anisotropic) dry etching through patterned hardmask layer 104, etching into substrate 102 and forming the one or more trenches 106 therein. Other suitable techniques for forming the one or more trenches 106 in substrate 102 will depend on a given application and will be apparent in light of this disclosure.

The dimensions of the one or more trenches 106 can be customized for a given target application or end-use and may depend, at least in part, on the dimensions of the overlying patterned hardmask layer 104 and/or patterning process(es) used to form the one or more trenches 106. In some embodiments, a given trench 106 may have a width (W), for example, less than or equal to about 50 nm (e.g., less than or equal to about 10 nm, less than or equal to about 20 nm, less than or equal to about 30 nm, or less than or equal to about 40 nm). In some instances, a given trench 106 may have a width (W), for example, in the range of about 5-15 nm. In some embodiments, a given trench 106 may have a height (H), for example, in the range of about 100-200 nm (e.g., about 125-145 nm, about 145-165 nm, about 165-185 nm, or any other sub-range in the range of about 100-200 nm). In a more general sense, and in accordance with some embodiments, a given trench 106 may be provided with a height-to-width (H/W) aspect ratio, for example, in the range of about 1:1 to 40:1, or a sub-range thereof, such as in the range of 10:1 to 40:1 or 10:1 to 20:1 (e.g., about 5:1 to 10:1, about 10:1 to 15:1, or about 25:1, or 30:1, or 35:1, or 40:1, or 45:1, or any other sub-range in the range of about 1:1 to 40:1). Other suitable dimensions for the one or more trenches 106 formed in substrate 102 will depend on a given application and will be apparent in light of this disclosure.

Also, the geometry and/or spacing of the one or more trenches 106 can be customized for a given target application or end-use and may depend, at least in part, on the dimensions of the overlying patterned hardmask layer 104 and/or patterning process(es) used to form the one or more trenches 106. In some embodiments, a given trench 106 may have a generally well-like or trench-like configuration having a substantially rectangular cross-sectional profile (e.g., as can be seen generally from FIG. 1). In some embodiments, a given trench 106 may have substantially vertical sidewalls (e.g., substantially perpendicular to the upper surface of the underlying substrate 102). In some instances, neighboring trenches 106 may be substantially equidistantly spaced from one another (e.g., may exhibit a substantially constant spacing within substrate 102). In other instances, however, the spacing of trenches 106 within substrate 102 may be varied as desired. Other suitable geometries and spacing for the one or more trenches 106 of substrate 102 will depend on a given application and will be apparent in light of this disclosure.

The patterning of semiconductive substrate 102 with one or more trenches 106 may result in the presence of one or more fin-like prominences extending from semiconductive substrate 102 (e.g., from an upper surface thereof, as can be seen in FIG. 1). In accordance with some embodiments, these fin-like semiconductive bodies 108 can be utilized, for example, in forming fin-based transistor devices and/or other suitable fin-based semiconductor architectures, as will be apparent in light of this disclosure. The dimensions, geometry, and/or spacing of the one or more semiconductive bodies 108 of substrate 102 can be customized as desired for a given target application or end-use.

Figure 2:
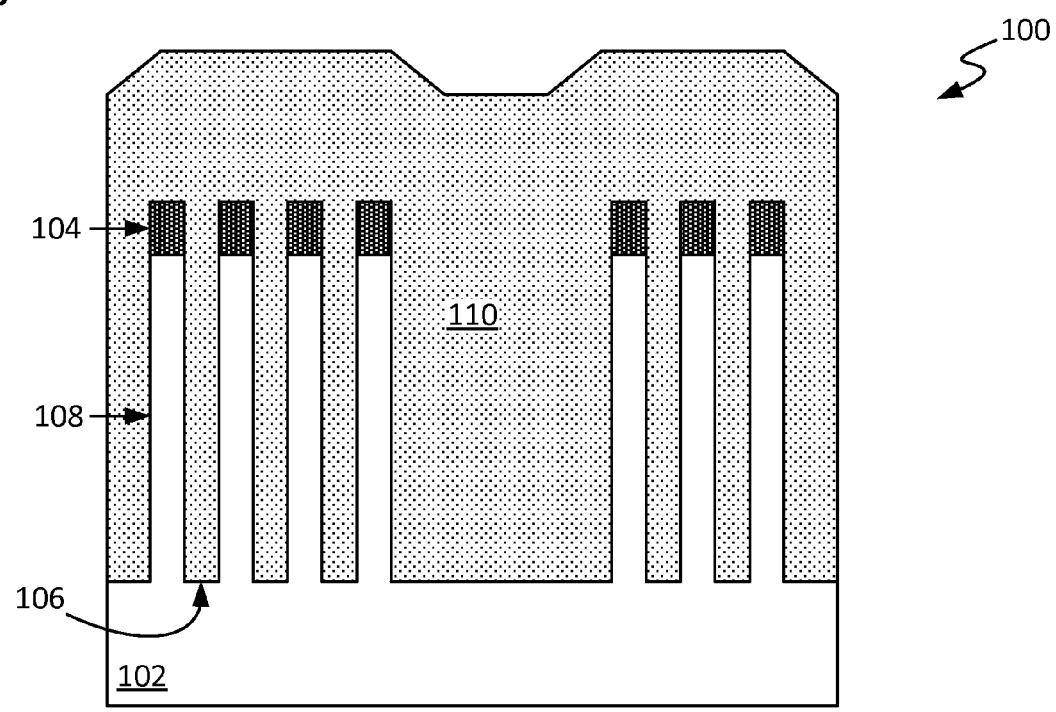
FIG. 2 is a cross-sectional view of the IC of FIG. 1 after deposition and curing of a dielectric layer, in accordance with an embodiment of the present disclosure.

The process may continue as in FIG. 2, which is a cross-sectional view of the IC 100 of FIG. 1 after deposition and curing of a dielectric layer 110, in accordance with an embodiment of the present disclosure. Dielectric layer 110 may begin, in accordance with some embodiments, as one or more flowable dielectric materials which are deposited over IC 100, cured in situ, and converted to produce an oxide-based, nitride-based, and/or carbide-based dielectric layer 110. In some cases, the resultant dielectric layer 110 may be defect-free, exhibiting no seams/voids or an otherwise acceptable level of such defects for a given target application or end-use. In some instances, the resultant dielectric layer 110 may exhibit a reduced etch rate and/or improved electrical isolation. As will be appreciated in light of this disclosure, the various process conditions (e.g., pressure; temperature; composition of ambient environment) of deposition, curing, and/or conversion of the flowable constituent material(s) of dielectric layer 110 can be customized as desired for a given target application or end-use, in accordance with some embodiments. As will be appreciated further, the materials and process conditions can be tuned, in accordance with some embodiments, to control the flowable nature of dielectric layer 110.

Dielectric layer 110 may begin as one or more flowable dielectric materials that can be deposited over IC 100, for example, using a flowable chemical vapor deposition (FCVD) process, in accordance with some embodiments. In some such cases, the selected FCVD process may utilize remote plasma-enhanced CVD (RPECVD). In some such instances, using such a remote plasma process may help to maintain a low processing temperature, which in turn can help to maintain desired fluidity/flowability of the constituent material(s) of dielectric layer 110. Other suitable techniques for depositing the constituent dielectric material(s) of dielectric layer 110 will depend on a given application and will be apparent in light of this disclosure.

Dielectric layer 110 can be flowed within the one or more trenches 106 and/or over an upper surface of patterned semiconductive substrate 102, as desired. In some cases, it may be desirable to flow a sufficient amount of the constituent material(s) so as to provide a sufficient overburden of dielectric layer 110 with respect to semiconductive substrate 102 and its one or more semiconductive bodies 108 for subsequent processing (e.g., planarization and/or recessing, as discussed below with reference to FIGS. 3-4).

As previously noted, dielectric layer 110 may begin as one or more constituent materials which are subsequently converted to an oxide-based, nitride-based, and/or carbide-based dielectric layer 110, in accordance with some embodiments. To that end, in some embodiments, dielectric layer 110 may begin, for example, as a flow of a silazane $(SiH_2NH)_n$-based polymer with a silicon-based precursor, such as Trisilylamine $(N(SiH_3)_3)$. However, it should be noted that the present disclosure is not so limited, as in a more general sense, the individual precursor(s) and reactive gas(es), as well as their ratio, can be customized as desired for a given target application or end-use, in accordance with some embodiments. As will be appreciated further in light of this disclosure, it may be desirable to ensure that the selected constituent material(s) of dielectric layer 110 are: (1) flowable (e.g., compatible with deposition using a FCVD process); and/or (2) suitable for deposition within trenches 106 of relatively high aspect ratio (e.g., having an aspect ratio in the range of about 10:1 to 40:1, in some cases). Other suitable materials for dielectric layer 110 will depend on a given application and will be apparent in light of this disclosure.

After deposition, the one or more constituent materials of dielectric layer 110 may be cured in situ over IC 100, in accordance with some embodiments. To that end, dielectric layer 110 may be cured, for example, using an ambient environment of ozone $(O_3)$, oxygen $(O_2)$, and/or other initiation oxidant. In some embodiments, curing of dielectric layer 110 may be performed under a flow of $O_3$ having a flow rate, for example, in the range of about $2.0 \times 10^4$-$5.4 \times 10^4$ sccm. In some embodiments, curing of dielectric layer 110 may be performed under a flow of $O_2$ having a flow rate, for example, in the range of about $2.5 \times 10^3$-$5.0 \times 10^3$ sccm. Other suitable techniques for in-situ curing of the constituent material(s) of dielectric layer 110 will depend on a given application and will be apparent in light of this disclosure.

The process conditions during curing of dielectric layer 110 may be customized as desired for a given target application or end-use. In some cases, curing may be performed at a temperature, for example, in the range of about 120-180° C. (e.g., about 145-155° C., or any other sub-range in the range of about 120-180° C.). In some cases, curing may be performed at a pressure, for example, in the range of about 500-800 mTorr (e.g., about 550-650 mTorr, or any other sub-range in the range of about 500-800 mTorr).

In some cases, curing dielectric layer 110 in an oxidant-rich environment may help to reduce silicon-nitrogen (Si—N) bonds and/or silicon-hydrogen (Si—H) bonds present after deposition of dielectric layer 110. That is, in some instances, the presence of silicon-hydrogen (Si—H) bonds may be decreased significantly (e.g., due to their relatively lower bond energy in an $O_3$-based curing treatment) and silicon-oxygen (Si—O) bond intensity may increase significantly and come to replace the silicon-nitrogen (Si—N) bonds present in dielectric layer 110. Thus, in some cases, an as-deposited dielectric layer 110 can be converted to a stable oxide, such as silicon dioxide $(SiO_2$, or silica). In some other instances, as-deposited dielectric layer 110 can be converted to a stable nitride, such as silicon nitride $(Si_3N_4)$. In some still other instances, as-deposited dielectric layer 110 can be converted to a stable carbide. Other suitable post-conversion compositions for dielectric layer 110 will depend on a given application and will be apparent in light of this disclosure.

In accordance with some embodiments, after cure/conversion, dielectric layer 110 may undergo post-cure treatment, for example, to alter one or more of its characteristics. For instance, dielectric layer 110 can undergo post-cure processing, in accordance with some embodiments, to: (1) eliminate or otherwise reduce the presence of seams/voids within dielectric layer 110 over IC 100; (2) eliminate or otherwise reduce the presence of impurities within dielectric layer 110; (3) modify the dielectric properties of dielectric layer 110; (4) modify the etch rate of dielectric layer 110; and/or (5) increase the density of dielectric layer 110. Other characteristics of dielectric layer 110 which may be customized using the disclosed techniques will be apparent in light of this disclosure.

In accordance with some embodiments, dielectric layer 110 may undergo a wet chemical treatment process. In some cases, wet chemical treatment can be performed, for instance, using a wet bench process which utilizes hot de-ionized water (HDIW). In some other cases, wet chemical treatment can be performed, for instance, using a single wafer wet process which utilizes de-ionized water (DIW) at a temperature in the range of about 40-80° C. (e.g., about 45-60° C., or any other sub-range in the range of about 40-80° C.). In some still other cases, wet chemical treatment can be performed, for instance, using a single wafer wet process which utilizes a standard SC-1 chemistry utilizing at least one of ammonium hydroxide ($NH_4OH$), hydrogen peroxide ($H_2O_2$), hot de-ionized water (HDIW), and/or de-ionized water (DIW) at a temperature, for example, in the range of about 50-100° C. (e.g., about 60-80° C., or any other sub-range in the range of about 50-100° C.). In some such cases, the flow rate of ammonium hydroxide ($NH_4OH$) may be in the range of about 30-200 mL/min (e.g., about 120-130 mL/min, or any other sub-range in the range of about 30-200 mL/min). The flow rate of hydrogen peroxide ($H_2O_2$) may be, in some cases, in the range of about 100-400 mL/min (e.g., about 230-260 mL/min, or any other sub-range in the range of about 100-400 mL/min). The flow rate of hot de-ionized water (HDIW) may be, in some cases, in the range of about 1,500-1,800 mL/min (e.g., about 1,600-1,650 mL/min, or any other sub-range in the range of about 1,500-1,800 mL/min). The flow rate of de-ionized water (DIW) may be, in some cases, in the range of about 300-400 mL/min (e.g., about 350-375 mL/min, or any other sub-range in the range of about 300-400 mL/min). Other suitable techniques for wet chemical treatment of dielectric layer 110 will depend on a given application and will be apparent in light of this disclosure.

Also, in accordance with some embodiments, dielectric layer 110 may undergo a thermal treatment process. Thermal treatment can be performed using any of a wide range of techniques, such as, for example: furnace annealing; rapid thermal annealing; flash annealing; ultraviolet (UV) light-based oxidation; and/or a combination of any one or more thereof. In some cases, a furnace-based, vertical directional solidification (VDS) process may be utilized, in which, within an environment of about 90% steam or greater, IC 100 is subjected to: (1) a first temperature in the range of about 180-240° C. (e.g., about 195-210° C., or any other sub-range in the range of about 180-240° C.) for about 1 hour; and (2) a second temperature in the range of about 450-525° C. (e.g., about 490-510° C., or any other sub-range in the range of about 450-525° C.) for about 2 hours. In some cases, and in accordance with some embodiments, thermal treatment of dielectric layer 110 may help, for example, to remove impurities, such as silicon-hydroxide (Si—OH) bonds and/or water ($H_2O$), which may be present in dielectric layer 110. Other suitable techniques for thermal treatment of dielectric layer 110 will depend on a given application and will be apparent in light of this disclosure.

In some cases, post-cure treatment of dielectric layer 110 may serve, at least in part, to modify its dielectric properties. For example, in some cases, dielectric layer 110 may undergo processing that results in its dielectric constant (κ-value) being in the range of about 4.0-6.0 (e.g., about 4.5-5.0, about 5.0-5.5, or any other sub-range in the range of about 4.0-6.0). However, as will be appreciated in light of this disclosure, higher and/or lower κ-value ranges may be provided for dielectric layer 110, as desired for a given target application or end-use, in accordance with some embodiments.

In some cases, post-cure treatment of dielectric layer 110 may serve, at least in part, to densify it. In some instances, this may help to ensure that the resultant densified dielectric layer 110 can withstand subsequent processing (e.g., etching, planarization, etc.). However, as will be appreciated in light of this disclosure, it may be desirable to ensure that the density of dielectric layer 110 is not made so excessive as to prevent or otherwise overly inhibit etching thereof. That is, in some instances, it may be desirable to ensure that dielectric layer 110 is sufficiently resistant, for example, to wet etching (e.g., by a hydrofluoric, or HF, acid-based wet etch chemistry), to provide for desired etching thereof. In a more general sense, the density of dielectric layer 110 can be customized as desired for a given target application or end-use, in accordance with some embodiments.

Figure 3:
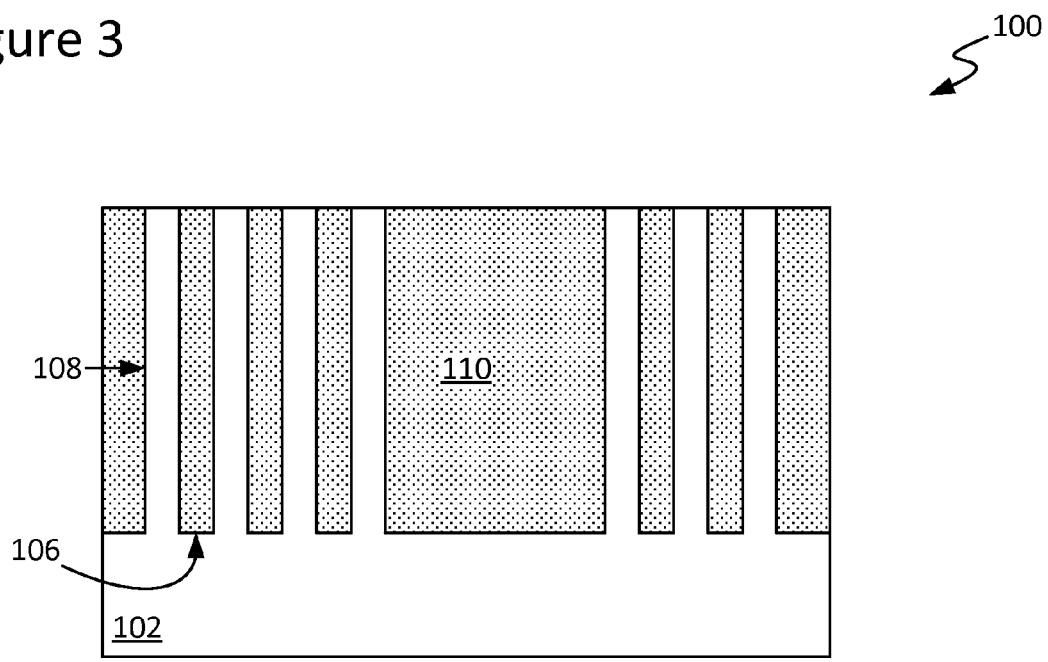
FIG. 3 is a cross-sectional view of the IC of FIG. 2 after planarization, in accordance with an embodiment of the present disclosure.

The process may continue as in FIG. 3, which is a cross-sectional view of the IC 100 of FIG. 2 after planarization, in accordance with an embodiment of the present disclosure. As will be appreciated in light of this disclosure, it may be desirable in some instances to planarize IC 100, for example, to remove any undesired: (1) excess of dielectric layer 110; (2) remainder of patterned hardmask layer 104; and/or (3) excess of the one or more semiconductive bodies 108 of substrate 102. To that end, IC 100 may undergo, for example: a chemical-mechanical planarization (CMP) process; an etch-and-clean process; and/or any other suitable planarization/polish process, as will be apparent in light of this disclosure. Other suitable techniques for planarizing IC 100 will depend on a given application and will be apparent in light of this disclosure.

Figure 4:
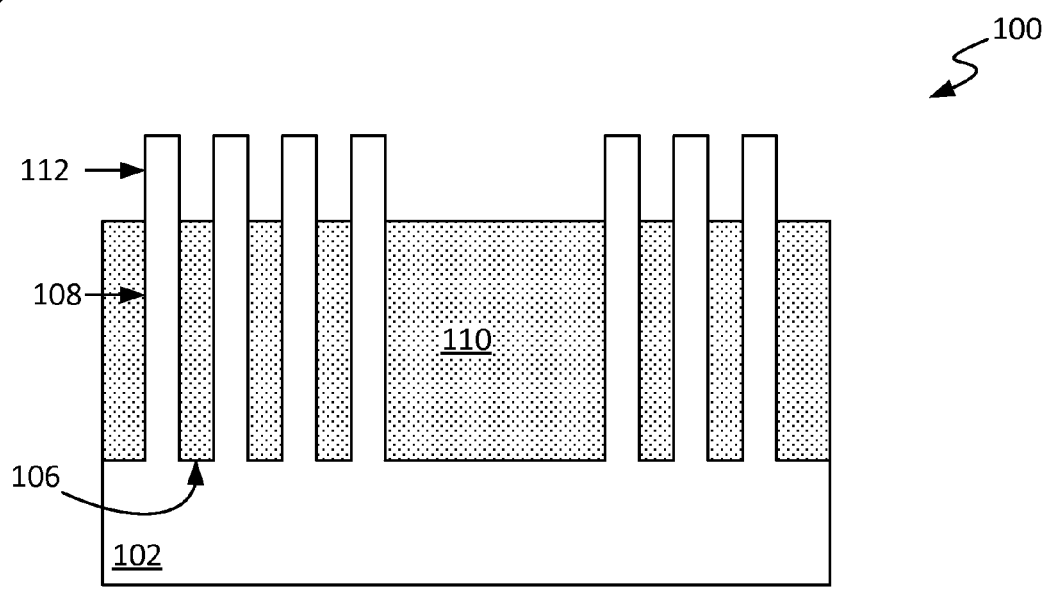
FIG. 4 is a cross-sectional view of the IC of FIG. 3 after recessing the dielectric layer, in accordance with an embodiment of the present disclosure.

The process may continue as in FIG. 4, which is a cross-sectional view of the IC 100 of FIG. 3 after recessing dielectric layer 110, in accordance with an embodiment of the present disclosure. Dielectric layer 110 can be recessed using any suitable technique (or combination of techniques). For example, in accordance with some embodiments, dielectric layer 110 may be recessed, for example, using a chemical (e.g., remote plasma-based) dry etch process. In accordance with some other embodiments, dielectric layer 110 may be recessed, for example, using a hydrofluoric acid (HF) acid-based wet etch chemistry. Recessing of dielectric layer 110 may help to reduce its thickness, thereby exposing one or more active portions 112 of the one or more semiconductive bodies 108. The newly exposed active portion 112 of a given semiconductive body 108 may be available for downstream use or further processing. For example, a given active portion 112 may provide a structure upon which an additional layer and/or component can be populated, in accordance with some embodiments. Thus, in a general sense, recessing of dielectric layer 110 may help to define the active fin area of IC 100, and dielectric layer 110 may provide isolation between active fin devices, in accordance with some embodiments. The amount by which dielectric layer 110 may be recessed can be customized as desired for a given target application or end-use, and, as will be appreciated in light of this disclosure, the dimensions of the active portion(s) 112 of IC 100 may depend, at least in part, on the recessing of dielectric layer 110. Other suitable techniques for recessing dielectric layer 110 will depend on a given application and will be apparent in light of this disclosure.

In accordance with some embodiments, dielectric layer 110 also may undergo a post-cure plasma treatment process. Plasma treatment can be performed, for example, using a high-density and/or low-density plasma annealing process. In some cases, plasma treatment of dielectric layer 110 may be performed using a helium (He)-based plasma, for example, with high power, low bias, and a temperature in the range of about 350-550° C. (e.g., about 400-525° C., or any other sub-range in the range of about 350-550° C.). However, the present disclosure is not so limited, as in a more general sense, the material composition, power, bias, and/or temperature utilized in the selected plasma treatment(s) can be customized as desired for a given target application or end-use, in accordance with some embodiments. Other suitable techniques for plasma treatment of dielectric layer 110 will depend on a given application and will be apparent in light of this disclosure.

Figure 5:
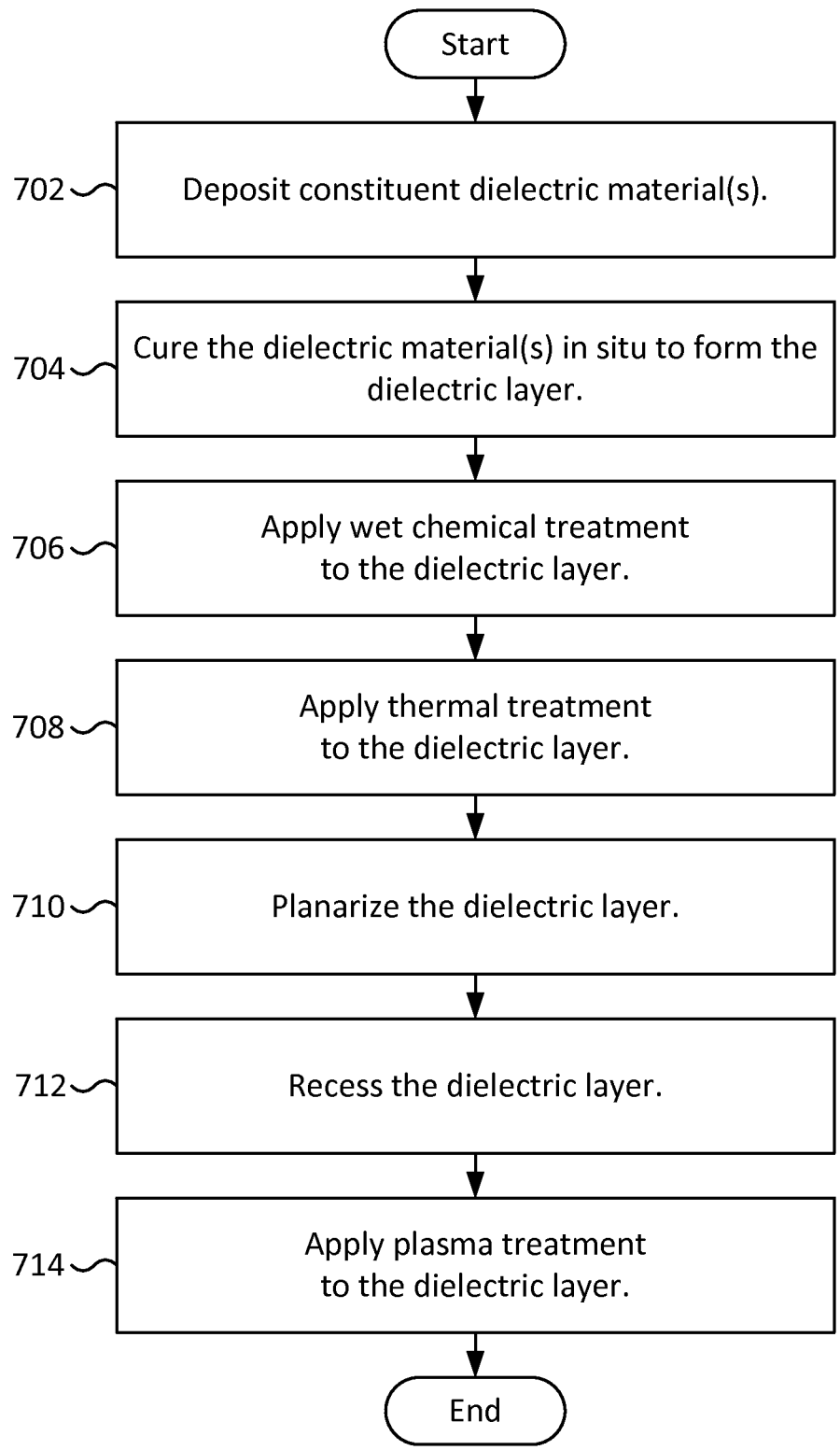
FIG. 5 is a flow diagram illustrating a process for forming a dielectric layer, in accordance with an embodiment of the present disclosure.

FIG. 5 is a flow diagram illustrating a process for forming a dielectric layer 110, in accordance with an embodiment of the present disclosure. As can be seen, the process may begin as in block 702 with depositing the constituent dielectric material(s) over IC 100. As previously discussed, the constituent precursor and reactive gases of dielectric layer 110 can be flowed using a flowable chemical vapor deposition (FCVD) process, in accordance with some embodiments. Furthermore, the material composition and ratio of the constituent materials of dielectric layer 110 and the process conditions during deposition can be varied to customize the resultant dielectric layer 110 as desired for a given target application or end-use, in accordance with some embodiments.

The process may continue as in block 704 with curing the dielectric material(s) to form dielectric layer 110 in situ over IC 100. As previously discussed, curing of the dielectric material(s) of dielectric layer 110 can be performed, for example, using an oxidant-based process, in accordance with some embodiments. Also, the process conditions during curing can be varied to customize the resultant dielectric layer 110 as desired for a given target application or end-use, in accordance with some embodiments. Furthermore, as discussed herein, curing may contribute, at least in part, to conversion of the constituent material(s) of dielectric layer 110 to a stable oxide-based, nitride-based, and/or carbide-based dielectric layer 110, in accordance with some embodiments.

The process may continue as in blocks 706 and 708 with applying a wet chemical treatment and a thermal treatment, respectively, to dielectric layer 110. As previously discussed, wet chemical and thermal processing can be performed using any of a wide range of techniques and may help, in some instances, to convert the constituent material(s) of dielectric layer 110 and/or to reduce the presence of impurities within dielectric layer 110, in accordance with some embodiments. Also, the process conditions during wet chemical and/or thermal treatment can be varied to customize the resultant dielectric layer 110 for a given target application or end-use, in accordance with some embodiments.

The process may continue as in blocks 710 and 712 with planarizing and recessing, respectively, the dielectric layer 110. As previously discussed, CMP or any other suitable planarization/polish process may be applied to IC 100, in accordance with some embodiments. Also, as previously discussed, recessing can be performed using any suitable dry and/or wet etch process, in accordance with some embodiments. After recessing, the active fin area of IC 100 (e.g., one or more active portions 112 of one or more semiconductive bodies 108) may be exposed and available for downstream use or further processing, in accordance with some embodiments.

The process may continue as in block 714 with applying a plasma treatment to the dielectric layer 110. As previously discussed, plasma processing can be performed using high-density and/or low-density plasma processes, and the conditions of such processing can be varied to customize the resultant dielectric layer 110 for a given target application or end-use, in accordance with some embodiments.

As will be appreciated in light of this disclosure, changes to any of the processing conditions discussed above with reference to blocks 702, 704, 706, 708, 710, 712, and/or 714 may impact the characteristics (e.g., quality, performance, dimensions, etc.) of the resultant dielectric layer 110, in accordance with some embodiments. As previously discussed, and in accordance with some embodiments, the disclosed techniques can be utilized, for example, to: (1) eliminate or otherwise reduce the presence of seams/voids within dielectric layer 110 over IC 100; (2) eliminate or otherwise reduce the presence of impurities within dielectric layer 110; (3) modify the dielectric properties of dielectric layer 110; (4) modify the etch rate of dielectric layer 110; and/or (5) increase the density of dielectric layer 110. Thus, in a more general sense, the disclosed techniques can be used, for example, to customize the dielectric layer 110 for a given target application or end-use, in accordance with some embodiments.

Example System

Figure 6:
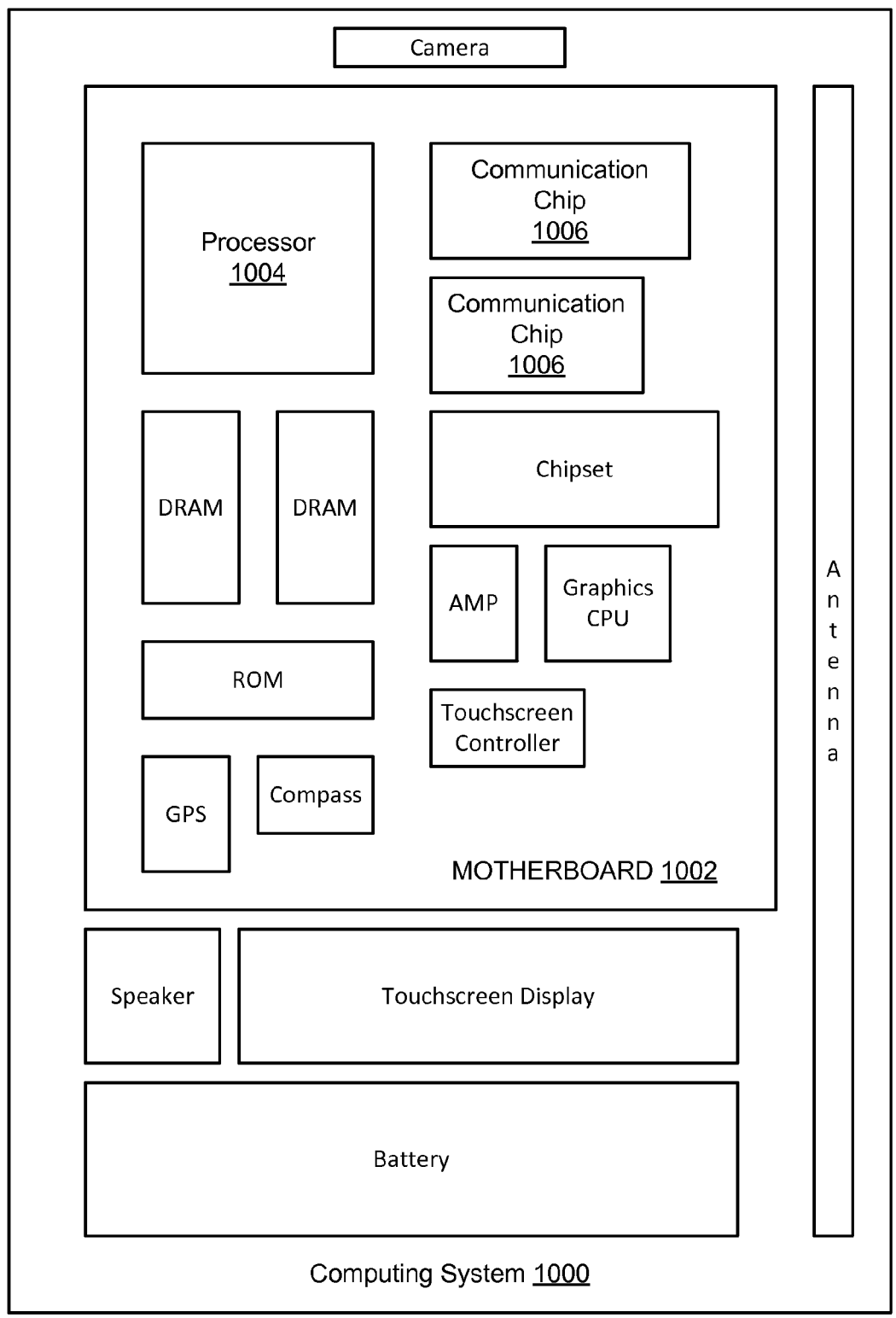
FIG. 6 illustrates a computing system implemented with integrated circuit structures or devices formed using the disclosed techniques in accordance with an example embodiment.

FIG. 6 illustrates a computing system 1000 implemented with integrated circuit structures or devices formed using the disclosed techniques in accordance with an example embodiment. As can be seen, the computing system 1000 houses a motherboard 1002. The motherboard 1002 may include a number of components, including, but not limited to, a processor 1004 and at least one communication chip 1006, each of which can be physically and electrically coupled to the motherboard 1002, or otherwise integrated therein. As will be appreciated, the motherboard 1002 may be, for example, any printed circuit board, whether a main board, a daughterboard mounted on a main board, or the only board of system 1000, etc. Depending on its applications, computing system 1000 may include one or more other components that may or may not be physically and electrically coupled to the motherboard 1002. These other components may include, but are not limited to, volatile memory (e.g., DRAM), non-volatile memory (e.g., ROM), a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth). Any of the components included in computing system 1000 may include one or more integrated circuit structures or devices formed using the disclosed techniques in accordance with an example embodiment. In some embodiments, multiple functions can be integrated into one or more chips (e.g., for instance, note that the communication chip 1006 can be part of or otherwise integrated into the processor 1004).

The communication chip 1006 enables wireless communications for the transfer of data to and from the computing system 1000. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 1006 may implement any of a number of wireless standards or protocols, including, but not limited to, Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing system 1000 may include a plurality of communication chips 1006. For instance, a first communication chip 1006 may be dedicated to shorter range wireless communications such as Wi-Fi and Bluetooth and a second communication chip 1006 may be dedicated to longer range wireless communications such as GPS, EDGE, GPRS, CDMA, WiMAX, LTE, Ev-DO, and others.

The processor 1004 of the computing system 1000 includes an integrated circuit die packaged within the processor 1004. In some embodiments, the integrated circuit die of the processor includes onboard circuitry that is implemented with one or more integrated circuit structures or devices formed using the disclosed techniques, as variously described herein. The term "processor" may refer to any device or portion of a device that processes, for instance, electronic data from registers and/or memory to transform that electronic data into other electronic data that may be stored in registers and/or memory.

The communication chip 1006 also may include an integrated circuit die packaged within the communication chip 1006. In accordance with some such example embodiments, the integrated circuit die of the communication chip includes one or more integrated circuit structures or devices formed using the disclosed techniques as described herein. As will be appreciated in light of this disclosure, note that multi-standard wireless capability may be integrated directly into the processor 1004 (e.g., where functionality of any chips 1006 is integrated into processor 1004, rather than having separate communication chips). Further note that processor 1004 may be a chip set having such wireless capability. In short, any number of processor 1004 and/or communication chips 1006 can be used. Likewise, any one chip or chip set can have multiple functions integrated therein.

In various implementations, the computing device 1000 may be a laptop, a netbook, a notebook, a smartphone, a tablet, a personal digital assistant (PDA), an ultra-mobile PC, a mobile phone, a desktop computer, a server, a printer, a scanner, a monitor, a set-top box, an entertainment control unit, a digital camera, a portable music player, a digital video recorder, or any other electronic device that processes data or employs one or more integrated circuit structures or devices formed using the disclosed techniques, as variously described herein.

Further Example Embodiments

The following examples pertain to further embodiments, from which numerous permutations and configurations will be apparent.

Example 1 is an integrated circuit including: a semiconductive substrate having first and second semiconductive fins extending from an upper surface thereof and a trench formed between the first and second semiconductive fins, wherein the trench has a width less than or equal to about 30 nm; and a dielectric layer formed over the semiconductive substrate, wherein the dielectric layer partially fills the trench, the dielectric layer extending from the upper surface of the semiconductive substrate to a point below an active portion of at least one of the first and/or second semiconductive fins.

Example 2 includes the subject matter of any of Examples 1 and 3-9, wherein the semiconductive substrate comprises at least one of silicon (Si) and/or silicon germanium (SiGe).

Example 3 includes the subject matter of any of Examples 1-2 and 4-9, wherein the trench has a height in the range of about 100-200 nm.

Example 4 includes the subject matter of any of Examples 1-3 and 5-9, wherein the trench has a height-to-width aspect ratio in the range of about 10:1 to 40:1.

Example 5 includes the subject matter of any of Examples 1-4 and 6-9, wherein the trench has a width of 20 nm or less.

Example 6 includes the subject matter of any of Examples 1-5 and 7-9, wherein the dielectric layer comprises at least one of an oxide, a nitride, and/or a carbide.

Example 7 includes the subject matter of any of Examples 1-6 and 8-9, wherein the dielectric layer has a dielectric constant (κ-value) in the range of about 4.0-6.0.

Example 8 includes the subject matter of any of Examples 1-7 and 9, wherein the dielectric layer is completely free of seam/void defects.

Example 9 includes the subject matter of any of Examples 1-8, wherein the active portion of at least one of the first and/or second semiconductive fins provides a structure upon which an additional layer and/or component can be populated.

Example 10 is a method of forming an integrated circuit, the method including: depositing a flowable dielectric over a semiconductive substrate having first and second semiconductive fins extending from an upper surface thereof and a trench formed between the first and second semiconductive fins, wherein the trench has a width less than or equal to about 30 nm; curing the flowable dielectric to form a dielectric layer over the semiconductive substrate, wherein the dielectric layer resides, at least in part, within the trench; and treating the dielectric layer to modify at least one of its dielectric properties, density, and/or etch rate.

Example 11 includes the subject matter of any of Examples 10 and 12-37, wherein depositing the flowable dielectric over the semiconductive substrate comprises using a flowable chemical vapor deposition (FCVD) process.

Example 12 includes the subject matter of Example 11, wherein the FCVD process utilizes remote plasma-enhanced CVD (RPECVD).

Example 13 includes the subject matter of any of Examples 10-12 and 14-37, wherein the flowable dielectric comprises at least one of a silazane $(SiH_2NH)_n$-based polymer and/or Trisilylamine $(N(SiH_3)_3)$.

Example 14 includes the subject matter of any of Examples 10-13 and 15-37, wherein curing the flowable dielectric comprises exposing it to at least one of ozone $(O_3)$ and/or oxygen $(O_2)$.

Example 15 includes the subject matter of Example 14, wherein the ozone $(O_3)$ is provided at a flow rate in the range of about $2.0 \times 10^4$-$5.4 \times 10^4$ sccm.

Example 16 includes the subject matter of Example 14, wherein the oxygen $(O_2)$ is provided at a flow rate in the range of about $2.5 \times 10^3$-$5.0 \times 10^3$ sccm.

Example 17 includes the subject matter of any of Examples 10-16 and 18-37, wherein curing the flowable dielectric is performed at a temperature in the range of about 120-180° C.

Example 18 includes the subject matter of any of Examples 10-17 and 19-37, wherein curing the flowable dielectric is performed at a pressure in the range of about 500-800 mTorr.

Example 19 includes the subject matter of any of Examples 10-18 and 20-37, wherein curing the flowable dielectric to form the dielectric layer converts the flowable dielectric to at least one of an oxide, a nitride, and/or a carbide.

Example 20 includes the subject matter of any of Examples 10-19 and 21-37, wherein treating the dielectric layer comprises applying a wet chemical treatment that utilizes at least one of ammonium hydroxide ($NH_4OH$), hydrogen peroxide ($H_2O_2$), hot de-ionized water (HDIW), and/or de-ionized water (DIW).

Example 21 includes the subject matter of Example 20, wherein the ammonium hydroxide ($NH_4OH$) is provided at a flow rate in the range of about 30-200 mL/min.

Example 22 includes the subject matter of Example 20, wherein the hydrogen peroxide ($H_2O_2$) is provided at a flow rate in the range of about 100-400 mL/min.

Example 23 includes the subject matter of Example 20, wherein the hot de-ionized water (HDIW) is provided at a flow rate in the range of about 1,500-1,800 mL/min.

Example 24 includes the subject matter of Example 20, wherein the de-ionized water (DIW) is provided at a flow rate in the range of about 300-400 mL/min.

Example 25 includes the subject matter of Example 20, wherein the wet chemical treatment is performed at a temperature in the range of about 40-80° C.

Example 26 includes the subject matter of Example 20, wherein the wet chemical treatment is performed at a temperature in the range of about 50-100° C.

Example 27 includes the subject matter of any of Examples 10-26 and 28-37, wherein treating the dielectric layer comprises applying a thermal treatment that utilizes at least one of furnace annealing, rapid thermal annealing, flash annealing, ultraviolet (UV) light-based oxidation, and/or a combination of any one or more thereof.

Example 28 includes the subject matter of any of Examples 10-27 and 29-37, wherein treating the dielectric layer comprises applying a thermal treatment that utilizes a furnace-based, vertical directional solidification (VDS) process in which the dielectric layer is subjected to an environment of about 90% steam or greater for a first period of time at a first temperature and for a second period of time at a second temperature that is different from the first temperature.

Example 29 includes the subject matter of Example 28, wherein the first period of time is about 1 hour, and wherein the first temperature is in the range of about 180-240° C.

Example 30 includes the subject matter of Example 28, wherein the second period of time is about 2 hours, and wherein the second temperature is in the range of about 450-525° C.

Example 31 includes the subject matter of any of Examples 10-30 and 32-37, wherein treating the dielectric layer comprises applying a plasma treatment that utilizes at least one of a high-density plasma annealing process and/or a low-density plasma annealing process.

Example 32 includes the subject matter of Example 31, wherein the plasma treatment utilizes a helium (He)-based plasma.

Example 33 includes the subject matter of any of Examples 10-32 and 34-37 and further includes planarizing the dielectric layer.

Example 34 includes the subject matter of any of Examples 10-33 and 35-37 and further includes etching the dielectric layer to recess it to a point below an active portion of at least one of the first and/or second semiconductive fins.

Example 35 includes the subject matter of Example 34, wherein etching comprises using a remote plasma dry etch process.

Example 36 includes the subject matter of Example 34, wherein etching comprises using a hydrofluoric acid (HF)-based wet etch process.

Example 37 is an integrated circuit formed using the method including the subject matter of any of Examples 10-36.

Example 38 is an integrated circuit including: a semiconductive substrate having a plurality of semiconductive fins extending from an upper surface thereof and a trench formed between each pair of neighboring semiconductive fins, wherein each trench has a width less than or equal to about 20 nm and a height-to-width aspect ratio in the range of about 10:1 to 40:1; and a dielectric layer formed over the semiconductive substrate, wherein the dielectric layer partially fills the trenches, the dielectric layer extending from the upper surface of the semiconductive substrate to a point below an active portion of each of the semiconductive fins, and wherein the dielectric layer is free of seam/void defects.

Example 39 includes the subject matter of any of Examples 38 and 40-41, wherein the semiconductive substrate comprises at least one of silicon (Si) and/or silicon germanium (SiGe), and wherein the dielectric layer comprises at least one of silicon dioxide ($SiO_2$) and/or silicon nitride ($Si_3N_4$).

Example 40 includes the subject matter of any of Examples 38-39 and 41, wherein the dielectric layer has a dielectric constant (κ-value) in the range of about 4.0-6.0.

Example 41 includes the subject matter of any of Examples 38-40, wherein the active portion of each semiconductive fin provides a structure upon which an additional layer and/or component can be populated.

The foregoing description of example embodiments has been presented for the purposes of illustration and description. It is not intended to be exhaustive or to limit the present disclosure to the precise forms disclosed. Many modifications and variations are possible in light of this disclosure. It is intended that the scope of the present disclosure be limited not by this detailed description, but rather by the claims appended hereto. Future-filed applications claiming priority to this application may claim the disclosed subject matter in a different manner and generally may include any set of one or more limitations as variously disclosed or otherwise demonstrated herein.

What is claimed is:

1. A method of forming an integrated circuit, the method comprising:
    depositing a flowable dielectric over a semiconductive substrate having first and second semiconductive fins extending from an upper surface thereof and a trench formed between the first and second semiconductive fins, wherein the trench has a width less than or equal to about 30 nm;
    curing the flowable dielectric to form a dielectric layer over the semiconductive substrate, wherein the dielectric layer resides, at least in part, within the trench; and
    treating the dielectric layer to modify at least one of its dielectric properties, density, and etch rate, wherein treating the dielectric layer comprises applying a thermal treatment that utilizes a furnace-based, vertical directional solidification (VDS) process in which the dielectric layer is subjected to an environment of about 90% steam or greater for a first period of time at a first temperature in the range of about 180-240° C. and for a second period of time at a second temperature in the range of about 450-525° C.

2. The method of claim 1, wherein depositing the flowable dielectric over the semiconductive substrate comprises using a flowable chemical vapor deposition (FCVD) process.

3. The method of claim 2, wherein the FCVD process utilizes remote plasma-enhanced CVD (RPECVD).

4. The method of claim 1, wherein the flowable dielectric comprises at least one of a silazane $(SiH_2NH)_n$-based polymer and Trisilylamine $(N(SiH_3)_3)$.

5. The method of claim 1, wherein curing the flowable dielectric comprises exposing it to at least one of ozone $(O_3)$ and oxygen $(O_2)$.

6. The method of claim 1, wherein curing the flowable dielectric is performed at a temperature in the range of about 120-180° C.

7. The method of claim 1, wherein curing the flowable dielectric is performed at a pressure in the range of about 500-800 mTorr.

8. The method of claim 1, wherein curing the flowable dielectric to form the dielectric layer converts the flowable dielectric to at least one of an oxide, a nitride, and a carbide.

9. The method of claim 1, wherein treating the dielectric layer further comprises applying a wet chemical treatment that utilizes at least one of ammonium hydroxide $(NH_4OH)$, hydrogen peroxide $(H_2O_2)$, hot de-ionized water (HDIW), and de-ionized water (DIW).

10. The method of claim 1, wherein treating the dielectric layer further comprises applying a thermal treatment that utilizes at least one of furnace annealing, rapid thermal annealing, flash annealing, ultraviolet (UV) light-based oxidation, and a combination of any one or more thereof.

11. The method of claim 1, wherein the flowable dielectric extends over an upper surface of at least one of the first and second semiconductive fins.

12. The method of claim 1, wherein treating the dielectric layer further comprises applying a plasma treatment that utilizes at least one of a high-density plasma annealing process and a low-density plasma annealing process.

13. The method of claim 1 further comprising planarizing the dielectric layer.

14. The method of claim 1 further comprising etching the dielectric layer to recess it to a point below an active portion of at least one of the first and second semiconductive fins.

* * * * *